US011955943B1

(12) United States Patent
Kim et al.

(10) Patent No.: US 11,955,943 B1
(45) Date of Patent: Apr. 9, 2024

(54) SEMICONDUCTOR DEVICE INCLUDING ON-DIE RESISTOR AND METHOD OF CALIBRATING ON-DIE RESISTOR

(71) Applicant: SK hynix Inc., Icheon-si (KR)

(72) Inventors: Dong Seok Kim, Icheon-si (KR); Joo Won Oh, Icheon-si (KR); Keun Jin Chang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/110,228

(22) Filed: Feb. 15, 2023

(30) Foreign Application Priority Data

Oct. 7, 2022 (KR) ........................ 10-2022-0129099

(51) Int. Cl.
*H03H 11/28* (2006.01)
*G05F 1/56* (2006.01)
*H03K 5/24* (2006.01)

(52) U.S. Cl.
CPC ............... *H03H 11/28* (2013.01); *G05F 1/56* (2013.01); *H03K 5/24* (2013.01)

(58) Field of Classification Search
None
See application file for complete search history.

(56) References Cited

U.S. PATENT DOCUMENTS 5,666,078 A * 9/1997 Lamphier ...... H03K 19/018585 327/108
6,924,660 B2 * 8/2005 Nguyen ............. H03K 19/0005 326/27
6,946,849 B1 * 9/2005 Lu ............................ H03F 1/42 324/601
7,205,787 B1 * 4/2007 Massoumi .......... H04L 25/0298 326/27
7,408,378 B2 * 8/2008 Best .................... H04L 25/0278 326/87
7,888,962 B1 * 2/2011 Om .................. H03K 19/01742 327/108
8,253,440 B2 * 8/2012 Maddux ......... H03K 19/018521 326/31
8,487,650 B2 * 7/2013 Fazeel ............ H03K 19/017545 326/27
9,264,039 B2 2/2016 Seol et al.

FOREIGN PATENT DOCUMENTS

KR 100838366 B1 6/2008

* cited by examiner

*Primary Examiner* — Thomas J. Hiltunen
(74) *Attorney, Agent, or Firm* — William Park & Associates Ltd.

(57) ABSTRACT

A semiconductor device includes an on-die resistor circuit comprising an on-die resistor, a calibration circuit configured to perform a calibration operation on the on-die resistor, and a calibration control circuit configured to control the calibration operation of the calibration circuit. The calibration circuit includes a current generating circuit configured to supply a calibration current to the on-die resistor and a comparing circuit configured to compare the magnitude of a first input signal that is generated by the calibration current and the on-die resistor with a magnitude of a second input signal that is generated by the calibration current and an external resistor.

17 Claims, 21 Drawing Sheets

200
210
211
212
220
221
420
410
REXT
OUT ("L")
VN1
VN32
SW6
("H")
N3
560
SW5
("H")
550
I2
CODE22
VDD
SW4
("L")
540
N2
SW3
("H")
530
SW2
("L")
520
R1
N1
R2
100
510
SW1
("L")
ROD 200
210
211
212
220
221
410
420
REXT
VDD
CODE28
ICAL
SW1 ("L")
SW2 ("L")
SW3 ("L")
SW4 ("L")
SW5 ("H")
SW6 ("H")
510
520
530
540
550
560
N1
N2
N3
VN3
R1
R2
ROD
100

200
420
410
REXT
220
221
210
SW6 ("L")
N3
560
SW5 ("L")
550
ICAL
212
CODE28
SW4 ("H")
540
VN22
N2
SW2 ("L")
520
SW3 ("L")
530
VDD
SW1 ("L")
510
ROD
CODE12
R1
N1
R2
211
100

200
210
211
212
220
221
VDD
ICAL
CODE28
R1
N1
R2
N2
N3
SW1 ("L")
SW2 ("L")
SW3 ("L")
SW4 ("L")
SW5 ("L")
SW6 ("H")
510
520
530
540
550
560
VN22
VN3
OUT ("H")
420
410
REXT
ROD
100

200
210
211
212
220
221
420
410
REXT
VDD
ICAL
CODE28
R1
N1
R2
530
SW3
("L")
540
SW4
("H")
VN28
N2
520
SW2
("L")
550
SW5
("L")
560
SW6
("L")
N3
100
510
SW1
("L")
ROD
CODE18

TEST APPARATUS
720
700
RTRA
REXT
710
RCNT
200
420
410
OUT
220
221
VN2
VN3
SW6
("H")
N3
560
VDD
ICAL
212
SW5
("L")
550
SW4
("L")
540
N2
SW2
("H")
520
510
SW1
("L")
ROD
100

SEMICONDUCTOR DEVICE INCLUDING ON-DIE RESISTOR AND METHOD OF CALIBRATING ON-DIE RESISTOR

CROSS-REFERENCE TO RELATED APPLICATION

The present application claims priority under 35 U.S.C. § 119(a) to Korean application number 10-2022-0129099, filed in the Korean Intellectual Property Office on Oct. 7, 2022, the entire disclosure of which is incorporated herein by reference.

BACKGROUND

The present disclosure relates to a semiconductor device, and particularly, to a semiconductor device including an on-die resistor and a method of calibrating an on-die resistor.

An on-die resistor may mean a resistor that is integrated into a system on chip (SoC) for impedance matching in an output stage or input stage thereof. In general, a resistance value of the on-die resistor is changed depending on a process, a voltage, and a temperature. Accordingly, a resistance value of the on-die resistor needs to be adjusted through the calibration of the on-die resistor. The calibration of the on-die resistor that is integrated into the SoC has a limit in that the accuracy of calibration is not high because the calibration is performed through external calibration means.

SUMMARY

In an embodiment, a semiconductor device may include an on-die resistor circuit comprising an on-die resistor, a calibration circuit configured to perform a calibration operation on the on-die resistor, and a calibration control circuit configured to control the calibration operation of the calibration circuit. The calibration circuit includes a current generating circuit configured to supply a calibration current to the on-die resistor and a comparing circuit configured to compare the magnitude of a first input signal that is generated by the calibration current and the on-die resistor with a magnitude of a second input signal that is generated by the calibration current and an external resistor.

Furthermore, in an embodiment, a method of calibrating an on-die resistor of a semiconductor device is a method of calibrating an on-die resistor of a semiconductor device in which the on-die resistor and a calibration circuit configured to perform calibration on the on-die resistor are integrated in a single chip form. The method may include setting a calibration current within the calibration circuit, performing a first calibration process that sets a first input voltage that is applied to the on-die resistor by the calibration current, performing a second calibration process that sets a second input voltage that is applied to an external resistor having a target resistance value of the on-die resistor by the calibration current, and performing a third calibration process that compares the first input voltage with the second input voltage and stores a resistance value of the on-die resistor when the first input voltage is higher than the second input voltage.

BRIEF DESCRIPTION OF THE DRAWINGS

Certain features of the disclosed technology are illustrated by various embodiments with reference to the attached drawings, in which.

DETAILED DESCRIPTION

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
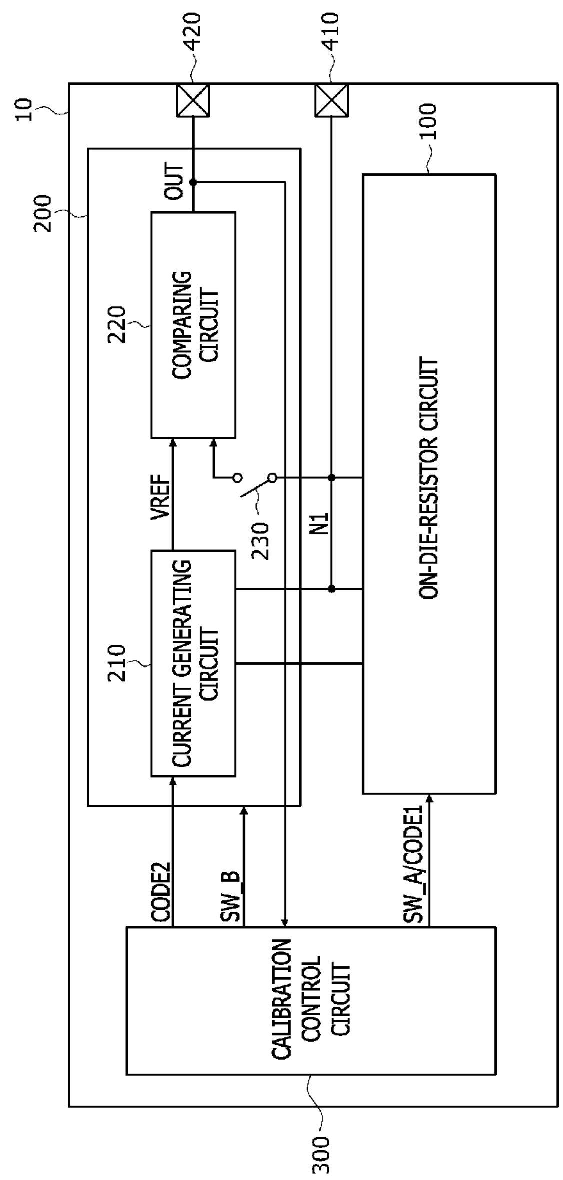
FIG. 1 is a block diagram illustrating a semiconductor device according to an embodiment of the present disclosure.

FIG. 1 is a block diagram illustrating a semiconductor device 10 according to an embodiment of the present disclosure. Referring to FIG. 1, the semiconductor device 10 may include an on-die resistor circuit 100, a calibration circuit 200, a calibration control circuit 300, a first pad 410, and a second pad 420. The semiconductor device 10 may be constituted within a single chip or may be constituted within a part of a single chip. That is, the on-die resistor circuit 100, the calibration circuit 200, and the calibration control circuit 300 may be integrated into a single die.

The on-die resistor circuit 100 may include an on-die resistor. In an example, the on-die resistor circuit 100 may be constructed by having a plurality of resistors that are disposed in an array format. In this case, a connection state of the plurality of resistors may be controlled by an e-fuse. That is, a resistance value of the on-die resistor may be determined based on a signal that is applied to the e-fuse. The on-die resistor circuit 100 may be configured to have a resistance value that varies based on a value of a resistance adjustment code CODE1 that is transmitted by the calibration control circuit 300. The resistance adjustment code CODE1 may be constituted within a digital signal. The on-die resistor circuit 100 may include a digital-analog converter (DAC) configured to convert the resistance adjustment code CODE1 into an analog signal. The on-die resistor circuit 100 may be connected to the calibration circuit 200 and the first pad 410. For a calibration operation for the on-die resistor, an electrical connection between the on-die resistor circuit 100 and the first pad 410 may be temporarily blocked. To this end, the on-die resistor circuit 100 may include a switch to electrically connect with the first pad 410 or block against the first pad 410. The switch within the on-die resistor circuit 100 may become on or off based on a switching control signal SW_A from the calibration control circuit 300.

The calibration circuit 200 may perform a calibration operation on the on-die resistor of the on-die resistor circuit 100. The calibration circuit 200 may include a current generating circuit 210, a comparing circuit 220, and a switch 230. Although not illustrated in this drawing, the current generating circuit 210 may include a plurality of switches. The switch 230 and the plurality of switches within the current generating circuit 210 may become on or off based on the switching control signals SW_Bs from the calibration control circuit 300.

The current generating circuit 210 may receive a current adjustment code CODE2 from the calibration control circuit 300. The current generating circuit 210 may provide a current that is increased in proportion to a value of the current adjustment code CODE2. The current generating circuit 210 may include a DAC configured to convert the current adjustment code CODE2 into an analog signal. The current generating circuit 210 may generate a reference voltage VREF in order to set a calibration current to be used for the calibration of the on-die resistor of the on-die resistor circuit 100. The reference voltage VREF that is generated by the current generating circuit 210 may be applied to the comparing circuit 220. The current generating circuit 210 may supply a calibration current to the on-die resistor circuit 100. Furthermore, the current generating circuit 210 may provide a calibration current to an external resistor, which is outside of the semiconductor device 10, through the first pad 410.

The comparing circuit 220 may be used for a calibration current setting operation in the current generating circuit 210 and a calibration operation for the on-die resistor of the on-die resistor circuit 100. First, during the calibration current setting process in the current generating circuit 210, the comparing circuit 220 may receive the reference voltage VREF from the current generating circuit 210. In such a process, the switch 230 may maintain an open state. The comparing circuit 220 may receive a voltage that is applied to the first pad 410, that is, a voltage that is applied to a node N1 in the state in which the switch 230 has been closed. The comparing circuit 220 may generate an output signal OUT by comparing the reference voltage VREF with a voltage of the node N1. Next, during the calibration process for the on-die resistor, the comparing circuit 220 may receive a first input signal that is generated by a calibration current and the on-die resistor, instead of the reference voltage VREF. Furthermore, the comparing circuit 220 may receive a voltage of the node N1 that is generated by a calibration current and an external resistor, as a second input signal. The comparing circuit 220 may generate the output signal OUT by comparing the magnitudes of the first input signal and the second input signal. The output signal OUT from the comparing circuit 220 may be transmitted to the calibration control circuit 300 and may also be transmitted to an external device, which is outside of the semiconductor device 10, through the second pad 420.

The switch 230 may maintain a closed state during a process in which the current generating circuit 210 sets a calibration current so that a voltage of the node N1 may be applied to the comparing circuit 220. When the calibration current is set in the current generating circuit 210, the switch 230 may maintain an open state during a process in which the first input signal is transmitted to the comparing circuit 220. The switch 230 may maintain a closed state during a process in which the second input signal is transmitted to the comparing circuit 220.

The calibration control circuit 300 may generate the resistance adjustment code CODE1 and the switching control signal SW_A capable of changing a resistance value of the on-die resistor of the on-die resistor circuit 100 and may transmit the resistance adjustment code CODE1 and the switching control signal SW_A to the on-die resistor circuit 100. The calibration control circuit 300 may generate the current adjustment code CODE2 capable of changing a current value of the current generating circuit 210 of the calibration circuit 200 and may transmit the current adjustment code CODE2 to the current generating circuit 210. Furthermore, the calibration control circuit 200 may generate the switching control signals SW_Bs and may transmit the switching control signals SW_Bs to the calibration circuit 200. The calibration control circuit 300 may change values of the resistance adjustment code CODE1 and the current adjustment code CODE2 based on the output signal OUT that is transmitted by the comparing circuit 220 of the calibration circuit 200 and may then output the resistance adjustment code CODE1 and the current adjustment code CODE2.

The first pad 410 and the second pad 420 may be provided as electrical coupling means between the semiconductor device 10 and an external device. The first pad 410 may be connected to the on-die resistor circuit 100 and the calibration circuit 200 in common. The second pad 420 may be connected to an output stage of the comparing circuit 220 of the calibration circuit 200. The first pad 410 may be electrically connected to or electrically blocked against the on-die resistor circuit 100 by the switch within the on-die resistor circuit 100. Furthermore, the first pad 410 may be electrically connected to or electrically blocked against the calibration circuit 200 by the switch within the calibration circuit 200.

Figure 2:
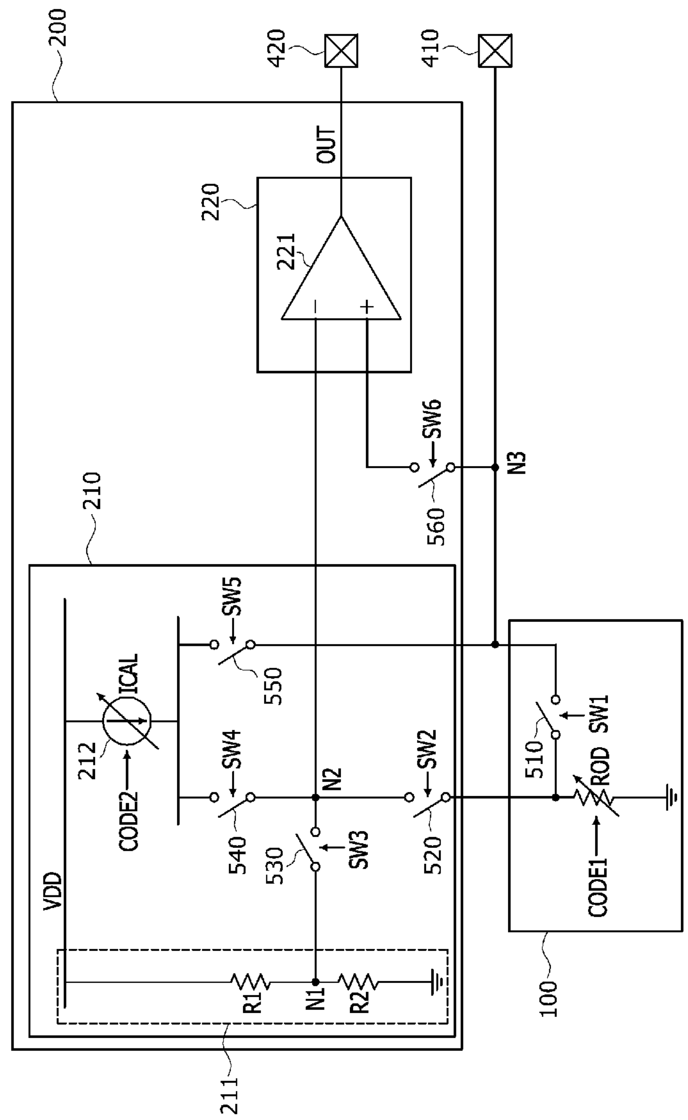
FIG. 2 is a circuit diagram illustrating an on-die resistor and a calibration circuit that are included in the semiconductor device of FIG. 1.

FIG. 2 is a circuit diagram illustrating the on-die resistor circuit 100 and the calibration circuit 200 that are included in the semiconductor device 10 of FIG. 1. A first switching control signal SW1 in FIG. 2 may mean the switching control signal SW_A in FIG. 1. Second to sixth switching control signals SW2 to SW6 in FIG. 2 may mean the switching control signals SW_Bs in FIG. 1. A third node N3 in FIG. 2 may mean the node N1 in FIG. 1. Furthermore, a sixth switch 560 in FIG. 2 may mean the switch 230 in FIG. 1.

Referring to FIG. 2, the on-die resistor circuit 100 may include an on-die resistor ROD and a first switch 510. The on-die resistor ROD that is presented in FIG. 2 may correspond to equivalent resistors of a plurality of resistors that is disposed in the on-die resistor circuit 100 in an array form.

The on-die resistor ROD of the on-die resistor circuit 100 may include a first terminal and a second terminal. The first terminal of the on-die resistor ROD may be connected to the calibration circuit 200 and the first pad 410. Specifically, the first terminal of the on-die resistor ROD may be connected to the third node N3 and the first pad 410 through the first switch 510. A switching operation of the first switch 510 may be controlled by the first switching control signal SW1 that is transmitted by the calibration control circuit (300 in FIG. 1). The first terminal of the on-die resistor ROD may be connected to a second node N2 of the calibration circuit 200 through a second switch 520 within the calibration circuit 200. A switching operation of the second switch 520 may be controlled by the second switching control signal SW2 that is transmitted by the calibration control circuit (300 in FIG. 1). The second terminal of the on-die resistor ROD may be connected to a ground terminal. As described with reference to FIG. 1, a resistance value of the on-die resistor ROD may be changed based on a value of the resistance adjustment code CODE1 that is transmitted by the calibration control circuit 300. The resistance adjustment code CODE1 may be a plurality of bits, for example, an 8-bit binary stream. In this case, if a 1 least significant bit (LSB) is set to 0.5 ohm, the resistance adjustment code CODE1 may change a resistance value of the on-die resistor ROD in a 0.5 ohm unit.

The current generating circuit 210 of the calibration circuit 200 may include a voltage division circuit 211 and a variable current source 212. The voltage division circuit 211 may include a first resistor R1 and a second resistor R2 that are disposed between a supply voltage line and the ground terminal in series. A supply voltage VDD may be applied to the supply voltage line. A first node N1 between the first resistor R1 and the second resistor R2 may be connected to a second node N2 through a third switch 530. A switching operation of the third switch 530 may be controlled by the third switching control signal SW3 that is transmitted by the calibration control circuit (300 in FIG. 1). In an example, if the first resistor R1 and the second resistor R2 have the same resistance value, a voltage in the first node N1 may become a half of the supply voltage VDD, that is, "VDD/2".

The variable current source 212 of the current generating circuit 210 may provide a calibration current ICAL that is used in a calibration process for the on-die resistor ROD. A first terminal of the variable current source 212 may be connected to the supply voltage line. A second terminal of the variable current source 212 may be connected to the second node N2 and the third node N3 in parallel. Specifically, the second terminal of the variable current source 212 may be connected to the second node N2 through a fourth switch 540. Furthermore, the second terminal of the variable current source 212 may be connected to the third node N3 through a fifth switch 550. Switching operations of the fourth switch 540 and the fifth switch 550 may be controlled by the fourth switching control signal SW4 and the fifth switching control signal SW5, respectively, that are transmitted by the calibration control circuit (300 in FIG. 1). As described with reference to FIG. 1, the amount of current of the variable current source 212 may be changed based on a value of the current adjustment code CODE2 that is transmitted by the calibration control circuit 300.

The comparing circuit 220 of the calibration circuit 200 may include a comparator 221 including a first input terminal, a second input terminal, and an output terminal. Although not illustrated in this drawing, the comparator 221 may include bias terminals. The first input terminal and second input terminal of the comparator 221 may be a negative input terminal and a positive input terminal, respectively. The first input terminal of the comparator 221 may be connected to the second node N2. Accordingly, when the second switch 520 of the calibration circuit 200 is closed, the first input terminal of the comparator 221 may be connected to the first terminal of the on-die resistor ROD. Furthermore, when the third switch 530 of the calibration circuit 200 is closed, the first input terminal of the comparator 221 may be connected to the first node N1 of the voltage division circuit 211. Furthermore, when the fourth switch 540 of the calibration circuit 200 is closed, the first input terminal of the comparator 221 may be connected to the second terminal of the variable current source 212. The second input terminal of the comparator 221 may be connected to the third node N3 through the sixth switch 560. The output terminal of the comparator 221 may be connected to the second pad 420. Although not illustrated in this drawing, the output terminal of the comparator 221 may also be connected to the calibration control circuit (300 in FIG. 1). The comparator 221 may compare the magnitudes of the first input signal and the second input signal that are input to the first input terminal and the second input terminal, respectively, and may output a result of the comparison as the output signal OUT through the output terminal. In the following several examples, when the first input signal is greater than the second input signal, the comparator 221 may output the output signal OUT having a low level. In contrast, when the second input signal is greater than the first input signal, the comparator 221 may output the output signal OUT having a high level.

Figure 3:
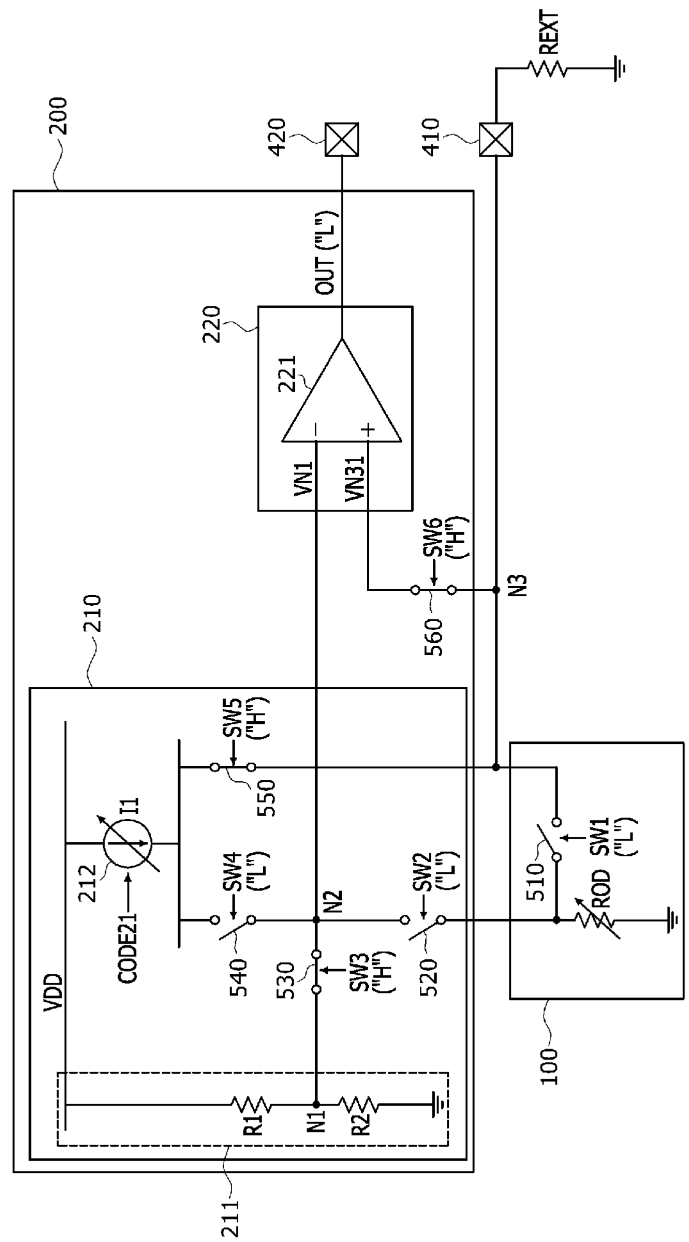
FIGS. 3 to 5 are circuit diagrams illustrated to describe a calibration current setting process of the calibration circuit in FIG. 2.
Figure 4:
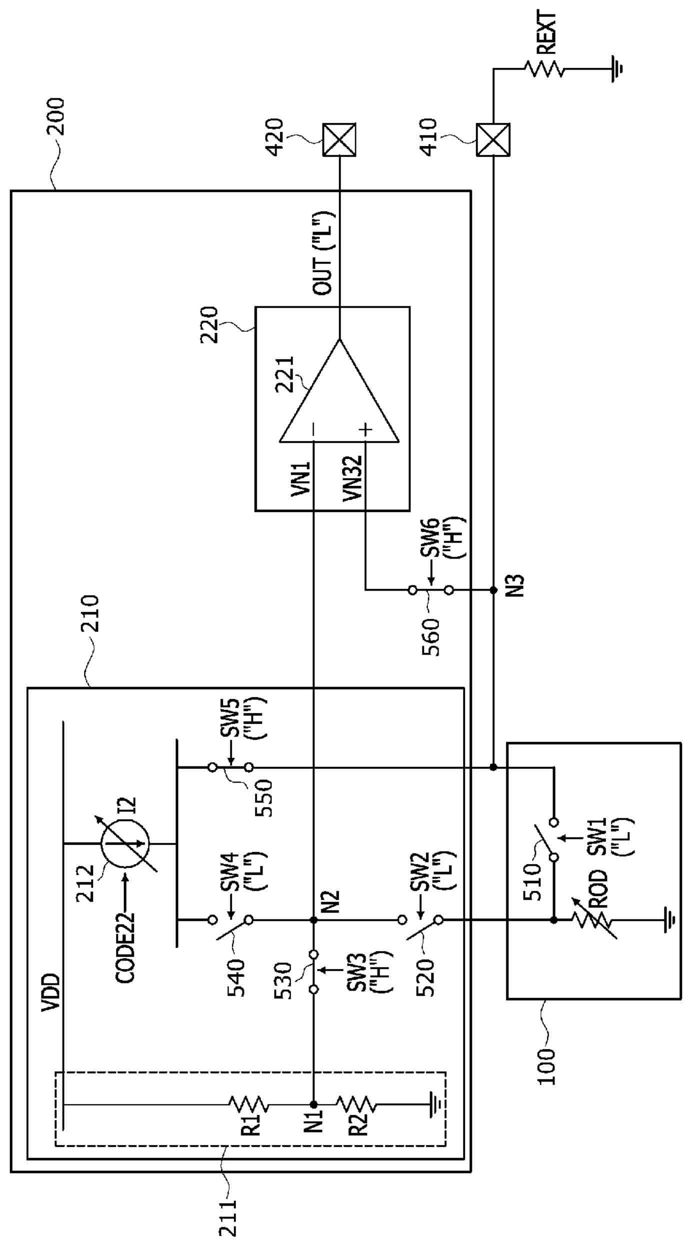
Figure 5:
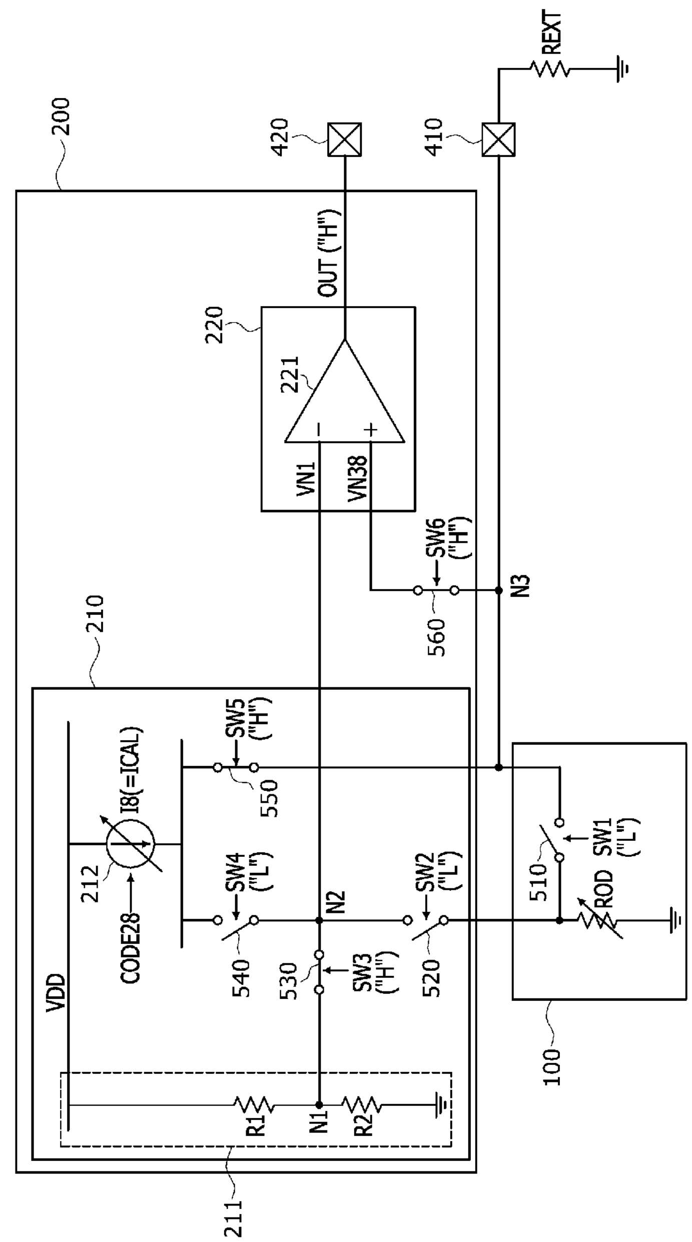

FIGS. 3 to 5 are circuit diagrams illustrated to describe a calibration current setting process of the calibration circuit 200 in FIG. 2. First, referring to FIG. 3, in order to set a calibration current of the variable current source 212, the external resistor REXT may be connected to the first pad 410. That is, an external resistor REXT may be disposed between the first pad 410 and the ground terminal, outside of the semiconductor device (10 in FIG. 1). The external resistor REXT may have a resistance value that is identical to a resistance value of the on-die resistor ROD, which will be set. In the state in which the external resistor REXT is connected between the first pad 410 and the ground terminal, the calibration control circuit (300 in FIG. 1) may provide the variable current source 212 with a first current adjustment code CODE21. Accordingly, the variable current source 212 may supply a current I1 corresponding to the first current adjustment code CODE21.

The calibration control circuit (300 in FIG. 1) may transmit, to the on-die resistor circuit 100, the first switching control signal SW1 having a low level "L". Furthermore, the calibration control circuit (300 in FIG. 1) may transmit, to the calibration circuit 200, the third switching control signal SW3, the fifth switching control signal SW5, and the sixth switching control signal SW6 having a high level "H", and the second switching control signal SW2 and the third switching control signal SW4 having a low level "L". The first switch 510 of the on-die resistor circuit 100 may be opened by such switching control signals. Furthermore, the third switch 530, fifth switch 550, and sixth switch 560 of the calibration circuit 200 may be closed, and the second switch 520 and the fourth switch 540 of the calibration circuit 200 may be opened. Accordingly, the current I1 from the variable current source 212 of the calibration circuit 200 may flow into the external resistor REXT through the third node N3 and the first pad 410. A first node voltage VN1 in the first node N1 may be applied to the first input terminal of the comparator 221 of the calibration circuit 200. Furthermore, a third node voltage VN31 in the third node N3 may be applied to the second input terminal of the comparator 221 of the calibration circuit 200. The first node voltage VN1 may be a reference voltage that is fixedly supplied by the voltage division circuit 211. In contrast, the third node voltage VN31 may be a voltage that is applied to both ends of the external resistor REXT by the current I1 corresponding to the first current adjustment code CODE21. The comparator 221 may compare the voltage levels of the first node voltage VN1 with the third node voltage VN31 that are applied to the first input terminal and the second input terminal, respectively. When the third node voltage VN31 is not higher than the first node voltage VN1, the comparator 221 may output the output signal OUT having a low level "L" through the output terminal. The output signal OUT having a low level "L" from the comparator 221 may be transmitted to the calibration control circuit (300 in FIG. 1).

Next, referring to FIG. 4, the calibration control circuit (300 in FIG. 1) that has received the output signal OUT having a low level "L" from the comparator 221 may provide a second current adjustment code CODE22 to the variable current source 212. The second current adjustment code CODE22 may have a greater value than the first current adjustment code (CODE21 in FIG. 3). The variable current source 212 may supply a current I2 corresponding to the second current adjustment code CODE22. In the state in which the first to sixth switching control signals SW1 to SW6 maintain the same logic level, the first node voltage VN1 and a third node voltage VN32 may be applied to the first input terminal and second input terminal of the comparator 221, respectively. The third node voltage VN32 may be a voltage that is applied to both ends of the external resistor REXT by the current I2 corresponding to the second current adjustment code CODE22. The comparator 221 may compare the voltage levels of the first node voltage VN1 and the third node voltage VN32 that are applied to the first input terminal and the second input terminal, respectively. When the third node voltage VN32 is not higher than the first node voltage VN1, the comparator 221 may output the output signal OUT having a low level "L" through the output terminal. The output signal OUT having a low level "L" from the comparator 221 may be transmitted to the calibration control circuit (300 in FIG. 1).

The calibration current setting process that has been described with reference to FIGS. 3 and 4 may be repeated and performed until the logic level of the output signal OUT from the comparator 221 is changed from a low level "L" to a high level "H". While the calibration current setting process is being performed, a value of the current adjustment code CODE2 that is provided by the calibration control circuit (300 in FIG. 1) to the variable current source 212 of the current generating circuit 210 may be increased. Accordingly, the amount of current that is generated by the variable current source 212 may also be increased. In this example, a case in which the logic level of the output signal OUT of the comparator 221 is not changed when one of the first to seventh current adjustment codes is provided to the variable current source 212 of the current generating circuit 210 has been presupposed.

Next, referring to FIG. 5, the calibration control circuit (300 in FIG. 1) that has received the output signal OUT having a low level "L" from the comparator 221 may provide the variable current source 212 with an eighth current adjustment code CODE28. The variable current source 212 may supply a current I8 corresponding to the eighth current adjustment code CODE28. In the state in which the first to sixth switching control signals SW1 to SW6 maintain the same logic level, the first node voltage VN1 and the third node voltage VN38 may be applied to the first input terminal and second input terminal of the comparator 221, respectively. The third node voltage VN38 may be a voltage that is applied to both ends of the external resistor REXT by the current I8 corresponding to the eighth current adjustment code CODE28. The comparator 221 may compare the voltage levels of the first node voltage VN1 and the third node voltage VN38 that are applied to the first input terminal and the second input terminal, respectively. When the third node voltage VN38 is higher than the first node voltage VN1, the comparator 221 may output the output signal OUT having a high level "H" through the output terminal. The output signal OUT having a high level "H", output from the comparator 221, may be transmitted to the calibration control circuit (300 in FIG. 1).

As described with reference to FIG. 3, the external resistor REXT that is connected to the third node N3 through the first pad 410, which is outside of the semiconductor device (10 in FIG. 1), may have a resistance value that is identical to a resistance value of the on-die resistor ROD, which will be calibrated. Accordingly, the third node voltage VN38 (i.e., a voltage that is applied to both ends of the external resistor REXT by the current I8 corresponding to the eighth current adjustment code CODE28) that is applied to the third node N3 may have a voltage level that is close to the first node voltage VN1 (i.e., the reference voltage) in the first node N1, which is set by the voltage division circuit 211. A case in which the voltage level of a voltage that is applied to both ends of the external resistor REXT by the current I8 is identical to the voltage level of a voltage that is applied to both ends of the on-die resistor ROD by the current I8 may mean a case in which a resistance value of the on-die resistor ROD and a resistance value of the external resistor REXT are substantially the same.

Accordingly, the calibration control circuit (300 in FIG. 1) may set, as the calibration current ICAL, the current I8 corresponding to the eighth current adjustment code CODE28 that is provided by the variable current source 212. The calibration control circuit (300 in FIG. 1) may perform such setting by storing the eighth current adjustment code CODE28.

FIGS. 6 to 14 are circuit diagrams illustrated to describe a calibration operation of the calibration circuit 200 in FIG. 2. In the following examples, the state in which the current I8 that is supplied from the variable current source 212 by the eighth current adjustment code CODE28 has been set as the calibration current ICAL through the processes of FIGS. 3 to 5 is presupposed. In this example, a calibration operation may include first to third calibration steps. The first to third calibration steps may be repeated and performed until a resistance value of the on-die resistor ROD reaches a desired resistance value or a target resistance value through the calibration process.

Figure 6:
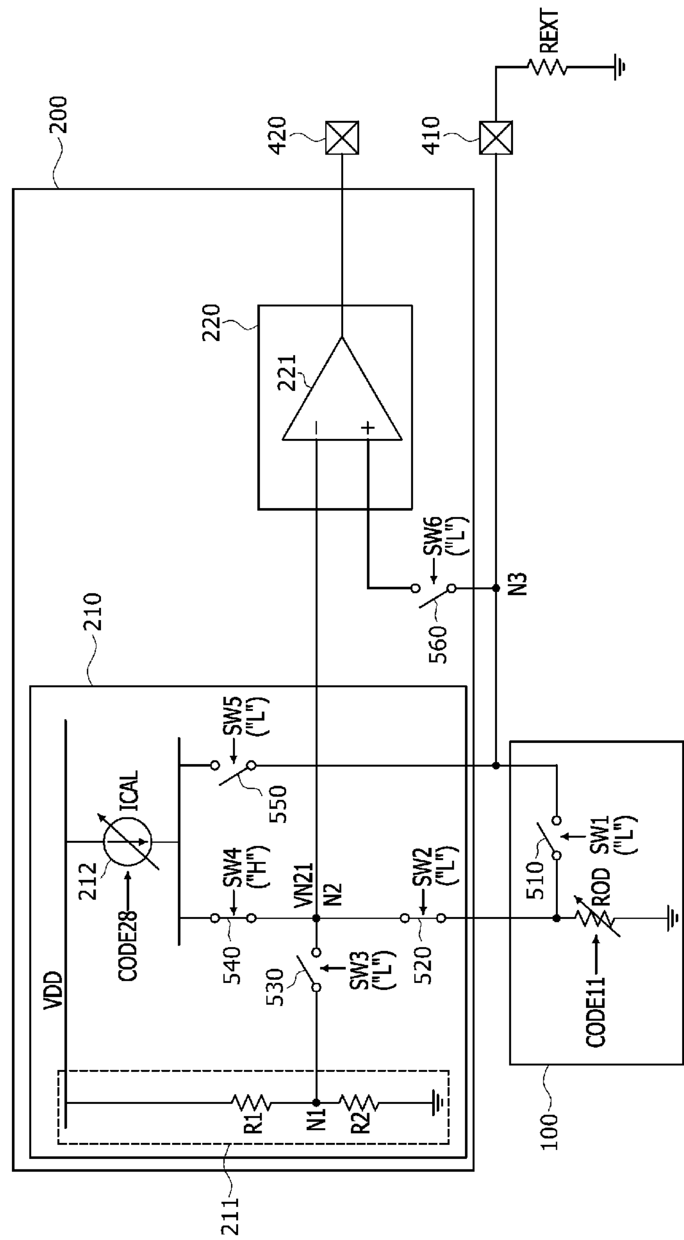
FIGS. 6 to 14 are circuit diagrams illustrated to describe a calibration operation of the calibration circuit in FIG. 2.

First, referring to FIG. 6, the calibration control circuit (300 in FIG. 1) may perform a control operation for the 1$^{st}$ first calibration step during the calibration process. Specifically, the calibration control circuit 300 may block an electrical connection between the on-die resistor circuit 100 and the third node N3. To this end, the calibration control circuit 300 may open the first switch 510 by providing the on-die resistor circuit 100 with the first switching control signal SW1 having a low level "L". Furthermore, the calibration control circuit 300 may block an electrical connection between the voltage division circuit 211 of the current generating circuit 210 and the second node N2. To this end, the calibration control circuit 300 may open the third switch 530 by providing the calibration circuit 200 with the third switching control signal SW3 having a low level "L". The calibration control circuit 300 may maintain both the first switch 510 and the third switch 530 at an open state while the first to third calibration steps of the calibration process are being performed.

The calibration control circuit 300 may open the fifth switch 550 and the sixth switch 560 by providing the calibration circuit 200 with the fifth switching control signal SW5 and the sixth switching control signal SW6 having a low level "L". Accordingly, an electrical connection between the variable current source 212 and the third node N3 and an electrical connection between the second input terminal of the comparator 221 and the third node N3 may be blocked. The calibration control circuit 300 may close the second switch 520 and the fourth switch 540 by providing the calibration circuit 200 with the second switching control signal SW2 and the fourth switching control signal SW4 having a high level "H". Accordingly, the variable current source 212 and the on-die resistor ROD may be electrically connected to the second node N2.

The calibration control circuit 300 may provide the on-die resistor ROD with a first resistance adjustment code CODE11. Accordingly, the on-die resistor ROD may have a resistance value corresponding to a value of the first resistance adjustment code CODE11. The calibration control circuit 300 may provide the variable current source 212 with the eighth current adjustment code CODE28. Accordingly, the variable current source 212 may supply the calibration current ICAL. The calibration current ICAL that is supplied from the variable current source 212 may flow into the on-die resistor ROD of the on-die resistor circuit 100 through the second node N2. A second node voltage VN21 in the second node N2 of the calibration circuit 200 may have the same voltage level as a voltage that is applied to both ends of the on-die resistor ROD by the calibration current ICAL. Although not illustrated in this drawing, the second node voltage VN21 may be stored by a first capacitor that is between the second node N2 and the ground terminal.

Figure 7:
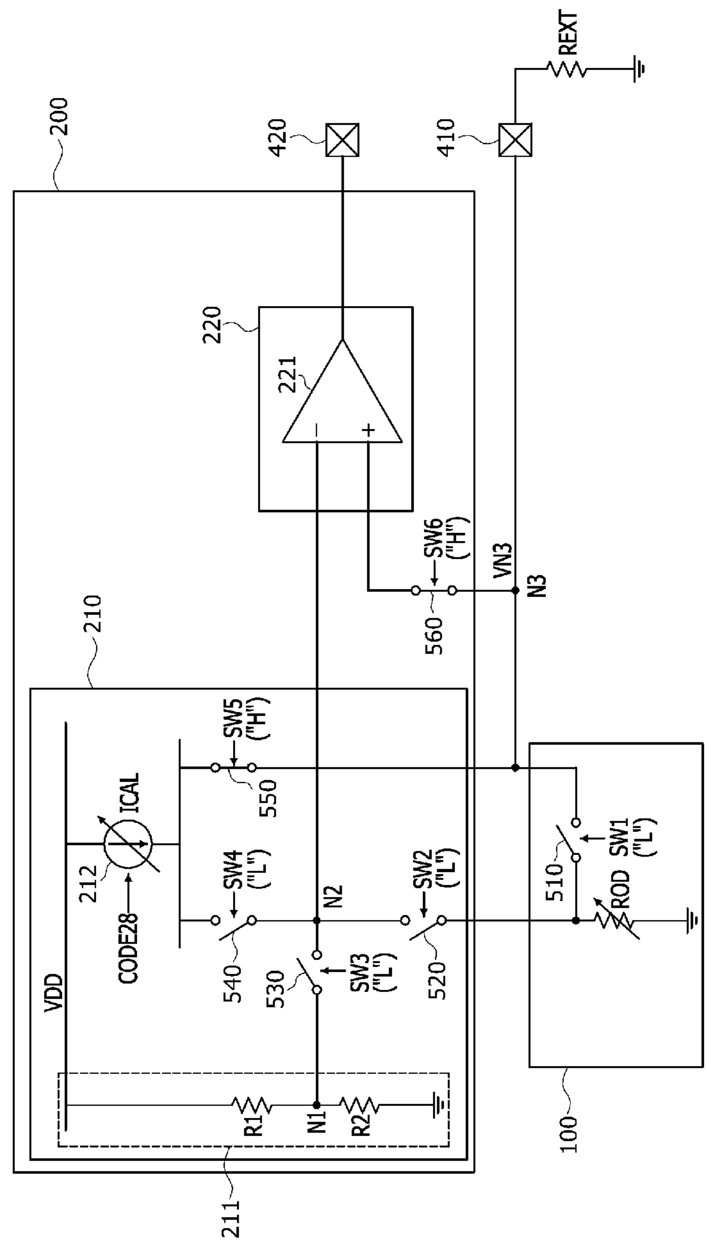

Next, referring to FIG. 7, the calibration control circuit (300 in FIG. 1) may perform a control operation for the 1$^{st}$ second calibration step during the calibration process. Specifically, the calibration control circuit 300 may open the second switch 520 and the fourth switch 540 by providing the calibration circuit 200 with the second switching control signal SW2 and the fourth switching control signal SW4 having a low level "L". Accordingly, an electrical connection between the variable current source 212 and the on-die resistor ROD and the second node N2 may be blocked. The calibration control circuit 300 may close the fifth switch 550 and the sixth switch 560 by providing the calibration circuit 200 with the fifth switching control signal SW5 and the sixth switching control signal SW6 having a high level "H". Accordingly, the variable current source 212 and the comparator 221 may be electrically connected to the third node N3. The calibration current ICAL that is supplied from the variable current source 212 may flow into the external resistor REXT through the third node N3 and the first pad 410. That is, a third node voltage VN3 in the third node N3 may have the same voltage level as a voltage that is applied to both ends of the external resistor REXT by the calibration current ICAL. Although not illustrated in this drawing, the third node voltage VN3 may be stored by a second capacitor between the third node N3 and the ground terminal.

Figure 8:
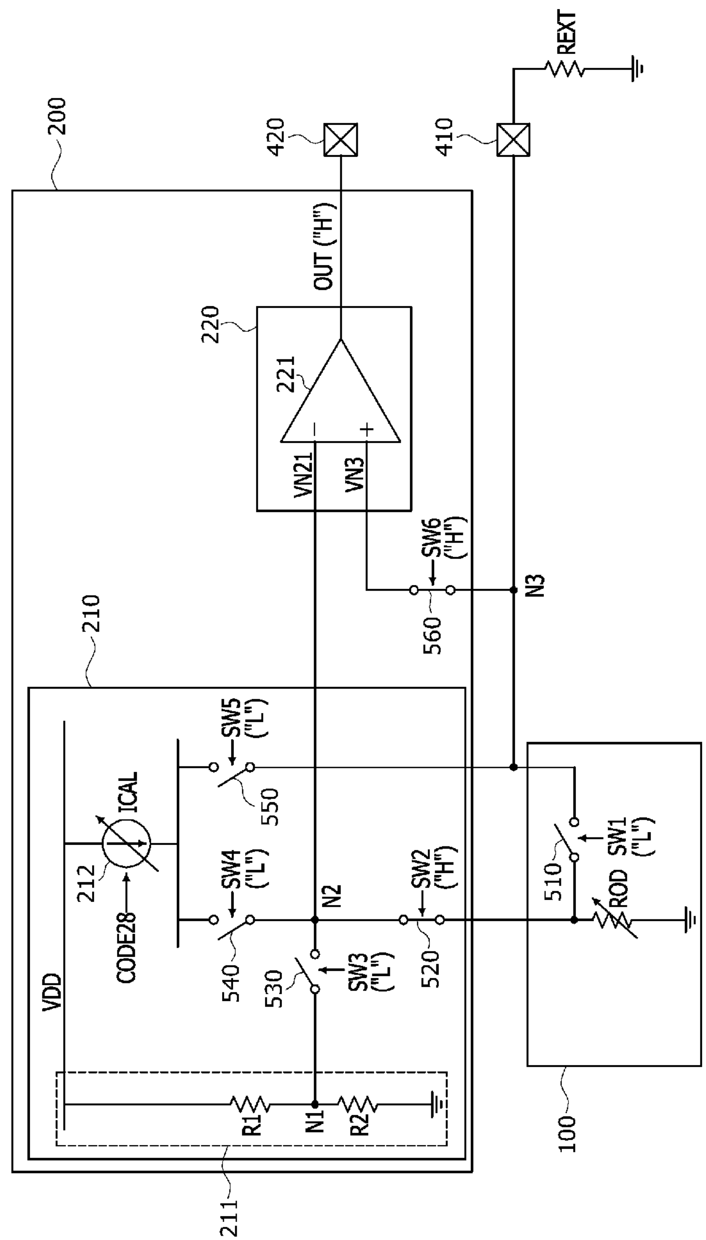

Next, referring to FIG. 8, the calibration control circuit (300 in FIG. 1) may perform a control operation for the 1$^{st}$ third calibration step during the calibration process. Specifically, the calibration control circuit 300 may open the fourth switch 540 and the fifth switch 550 by providing the calibration circuit 200 with the fourth switching control signal SW4 and the fifth switching control signal SW5 having a low level "L". Accordingly, an electrical connection between the variable current source 212 and the second node N2 and the third node N3 may be blocked. The calibration control circuit 300 may close the second switch 520 and the sixth switch 560 by providing the calibration circuit 200 with the second switching control signal SW2 and the sixth switching control signal SW6 having a high level "H". The second node voltage VN21 (i.e., a voltage that is applied to both ends of the on-die resistor ROD by the calibration current ICAL) may be supplied to the first input terminal of the comparator 221 (i.e., the negative input terminal) as a first input signal. Furthermore, the third node voltage VN3 (i.e., a voltage that is applied to both ends of the external resistor REXT by the calibration current ICAL) may be supplied to the second input terminal of the comparator 221 (i.e., the positive input terminal) as a second input signal. The comparator 221 may compare the first input signal and the second input signal. When the second node voltage VN21 is not higher than the third node voltage VN3, the comparator 221 may output the output signal OUT having a high level "H" through the output terminal. The output signal OUT having a high level "H" from the comparator 221 may be transmitted to the calibration control circuit 300. As the output signal OUT having a high level "H" is transmitted by the comparator 221, the calibration control circuit 300 may perform the 2$^{nd}$ first to third calibration steps on the condition that the resistance value of the on-die resistor ROD has been increased.

Figure 9:
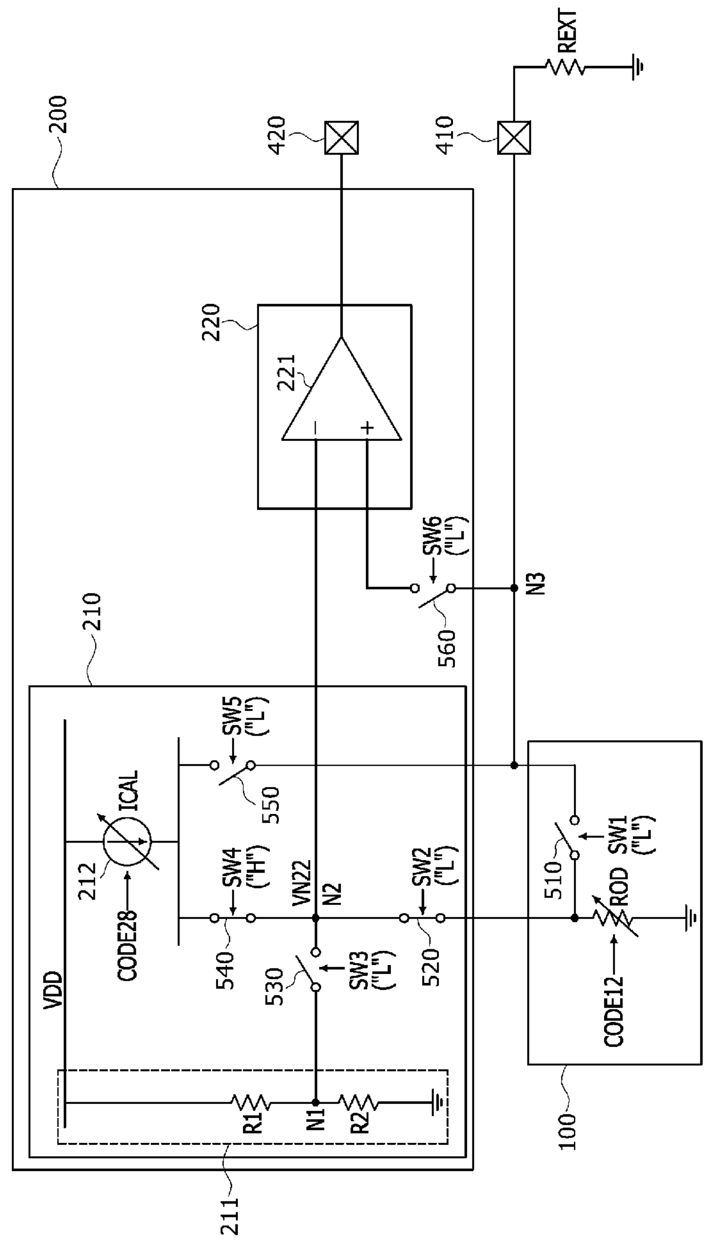

Referring to FIG. 9, the calibration control circuit (300 in FIG. 1) may perform a control operation for the 2$^{nd}$ first calibration step during the calibration process. Specifically, the calibration control circuit 300 may transmit, to the on-die resistor circuit 100 and the calibration circuit 200, the same switching control signals as those in the 1$^{st}$ first calibration step. Accordingly, the states of the first to sixth switches 510 to 560 may be the same as those that have been described with reference to FIG. 6. The calibration control circuit 300 may provide the on-die resistor ROD with a second resistance adjustment code CODE12. Accordingly, the on-die resistor ROD may have a resistance value corresponding to a value of the second resistance adjustment code CODE12. That is, the on-die resistor ROD may have a resistance value that is higher than a resistance value that has been set in the $1^{st}$ first to third calibration steps. The calibration control circuit 300 may provide the variable current source 212 with the eighth current adjustment code CODE28. Accordingly, the variable current source 212 may supply the calibration current ICAL. The calibration current ICAL that is supplied from the variable current source 212 may flow into the on-die resistor ROD of the on-die resistor circuit 100 through the second node N2. A second node voltage VN22 in the second node N2 of the calibration circuit 200 may have the same voltage level as a voltage that is applied to both ends of the on-die resistor ROD by the calibration current ICAL.

Figure 10:
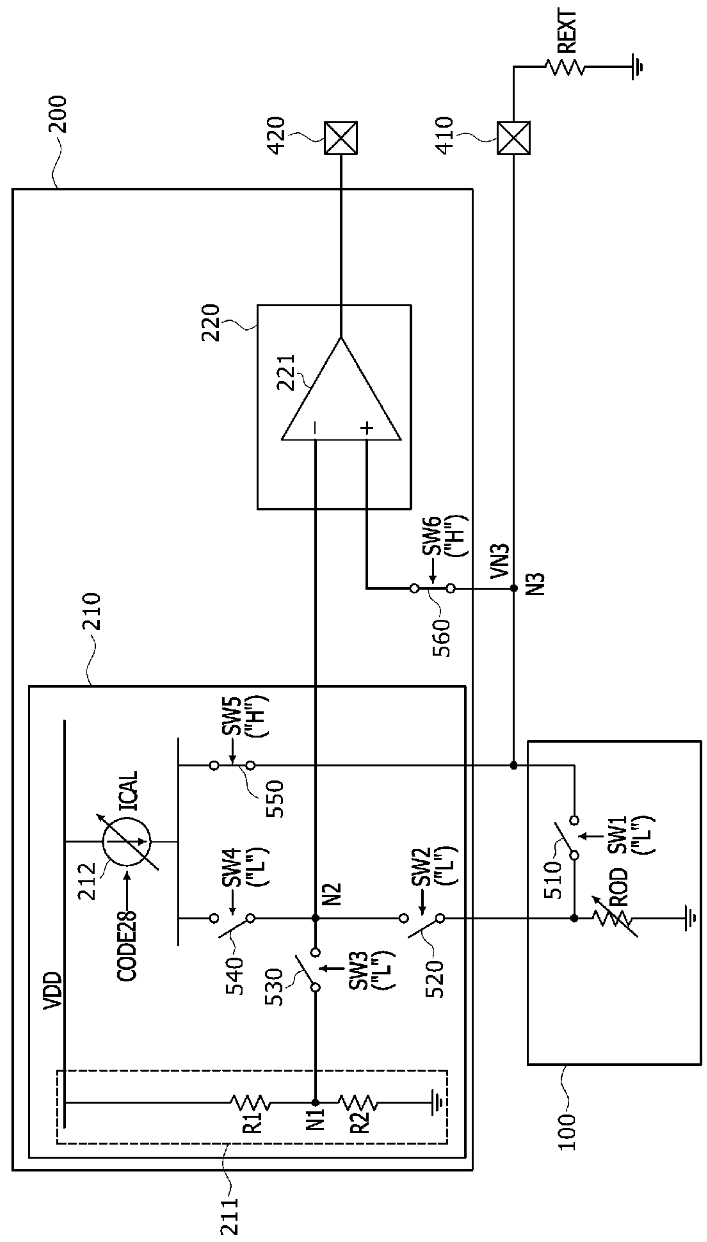

Referring to FIG. 10, the calibration control circuit (300 in FIG. 1) may perform a control operation for the $2^{nd}$ second calibration step during the calibration process. Specifically, the calibration control circuit 300 may transmit, to the on-die resistor circuit 100 and the calibration circuit 200, the same switching control signals as those in the $1^{st}$ second calibration step. Accordingly, the states of the first to sixth switches 510 to 560 may be the same as those that have been described with reference to FIG. 7. As in the $1^{st}$ second calibration step, the third node voltage VN3 in the third node N3 may have the same voltage level as a voltage that is applied to both ends of the external resistor REXT by the calibration current ICAL.

Figure 11:
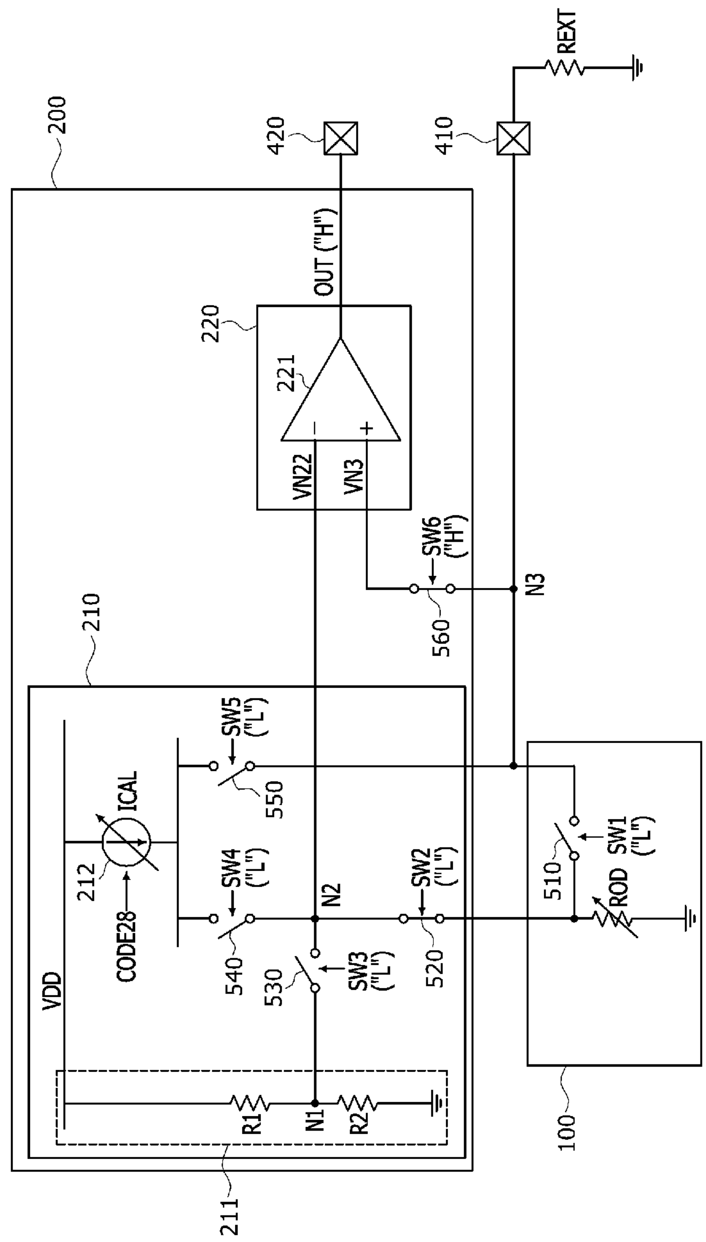

Referring to FIG. 11, the calibration control circuit (300 in FIG. 1) may perform a control operation for the $2^{nd}$ third calibration step during the calibration process. Specifically, the calibration control circuit 300 may transmit, to the on-die resistor circuit 100 and the calibration circuit 200, the same switching control signals as those in the $1^{st}$ third calibration step. Accordingly, the states of the first to sixth switches 510 to 560 may be the same as those that have been described with reference to FIG. 8. Accordingly, the second node voltage VN22 (i.e., a voltage that is applied to both ends of the on-die resistor ROD by the calibration current ICAL) may be supplied to the first input terminal of the comparator 221 (i.e., the negative input terminal) as the first input signal. Furthermore, the third node voltage VN3 (i.e., a voltage that is applied to both ends of the external resistor REXT by the calibration current ICAL) may be supplied to the second input terminal of the comparator 221 (i.e., the positive input terminal) as the second input signal. When the second node voltage VN22 is not higher than the third node voltage VN3, the comparator 221 may output the output signal OUT having a high level “H” through the output terminal. The output signal OUT having a high level “H” from the comparator 221 may be transmitted to the calibration control circuit 300. As the output signal OUT having a high level “H” is transmitted by the comparator 221, the calibration control circuit 300 may perform the $3^{rd}$ first to third calibration steps on the condition that the resistance value of the on-die resistor ROD has been increased.

The calibration process of the first calibration step, the second calibration step, and the third calibration step being sequentially performed may be repeated and performed until the logic level of the output signal OUT that is output by the comparator 221 is changed from a high level “H” to a low level “L”. As described above, a value of the resistance adjustment code CODE1 that is provided from the calibration control circuit (300 in FIG. 1) to the on-die resistor ROD of the on-die resistor circuit 100 may be increased whenever the calibration process is performed. Accordingly, a resistance value of the on-die resistor ROD may be increased in proportion to the increased value of the resistance adjustment code CODE1. Accordingly, if a voltage in the second node N2 becomes higher than a voltage in the third node N3, the logic level of the output signal OUT that is output by the comparator 221 may be changed from a high level “H” to a low level “L”. In this example, a case in which the comparator 221 outputs the output signal OUT having a high level “H” when one of the first to seventh resistance adjustment codes is provided to the on-die resistor ROD of the on-die resistor circuit 100 and a case in which the comparator 221 outputs the output signal OUT having a low level “L” when the eighth resistance adjustment code is provided to the on-die resistor ROD of the on-die resistor circuit 100 may be presupposed.

Figure 12:
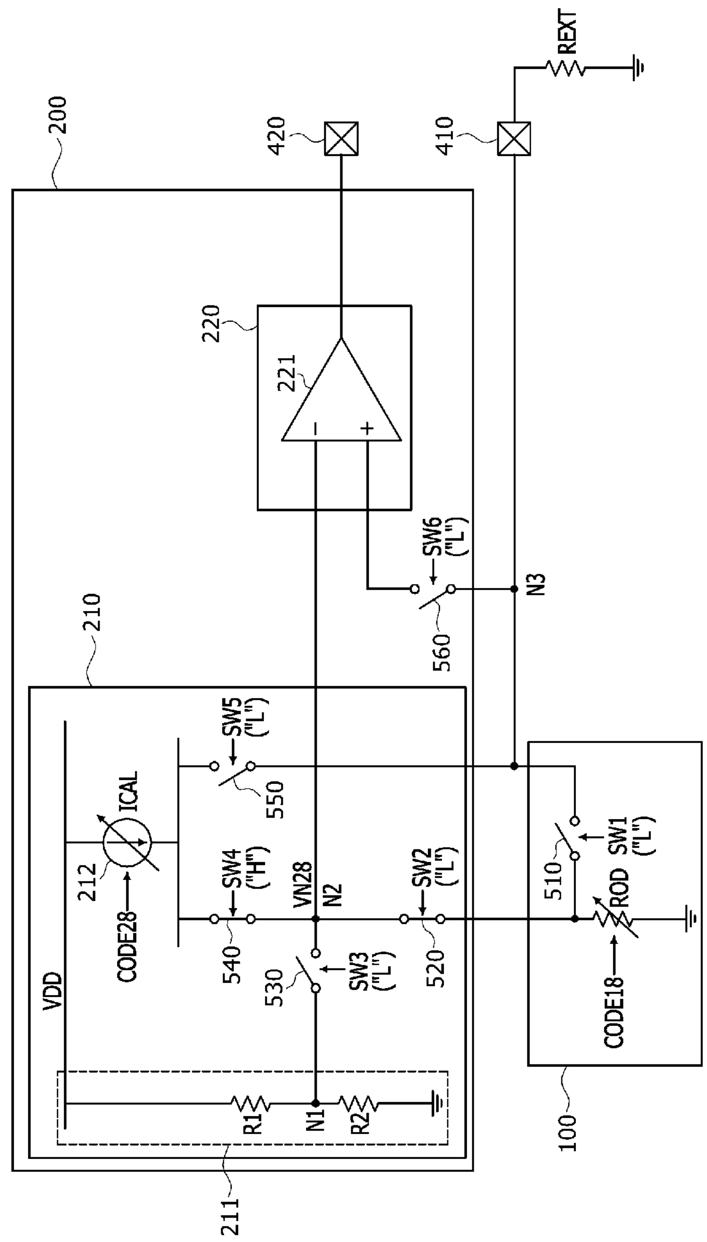

Referring to FIG. 12, the calibration control circuit (300 in FIG. 1) may perform a control operation for the $8^{th}$ first calibration step during the calibration process. Specifically, the calibration control circuit 300 may transmit, to the on-die resistor circuit 100 and the calibration circuit 200, the same switching control signals as those in the $1^{st}$ first calibration step. Accordingly, the states of the first to sixth switches 510 to 560 may be the same as those that have been described with reference to FIG. 6. The calibration control circuit 300 may provide the on-die resistor ROD with an eighth resistance adjustment code CODE18. Accordingly, the on-die resistor ROD may have a resistance value corresponding to a value of the eighth resistance adjustment code CODE18. That is, the on-die resistor ROD may have a resistance value that is higher than the resistance values in previous $7^{th}$ first to third calibration steps. The calibration control circuit 300 may provide the variable current source 212 with the eighth current adjustment code CODE28. Accordingly, the variable current source 212 may supply the calibration current ICAL. The calibration current ICAL that is supplied from the variable current source 212 may flow into the on-die resistor ROD of the on-die resistor circuit 100 through the second node N2. A second node voltage VN28 in the second node N2 of the calibration circuit 200 may have the same voltage level as a voltage that is applied to both ends of the on-die resistor ROD by the calibration current ICAL.

Figure 13:
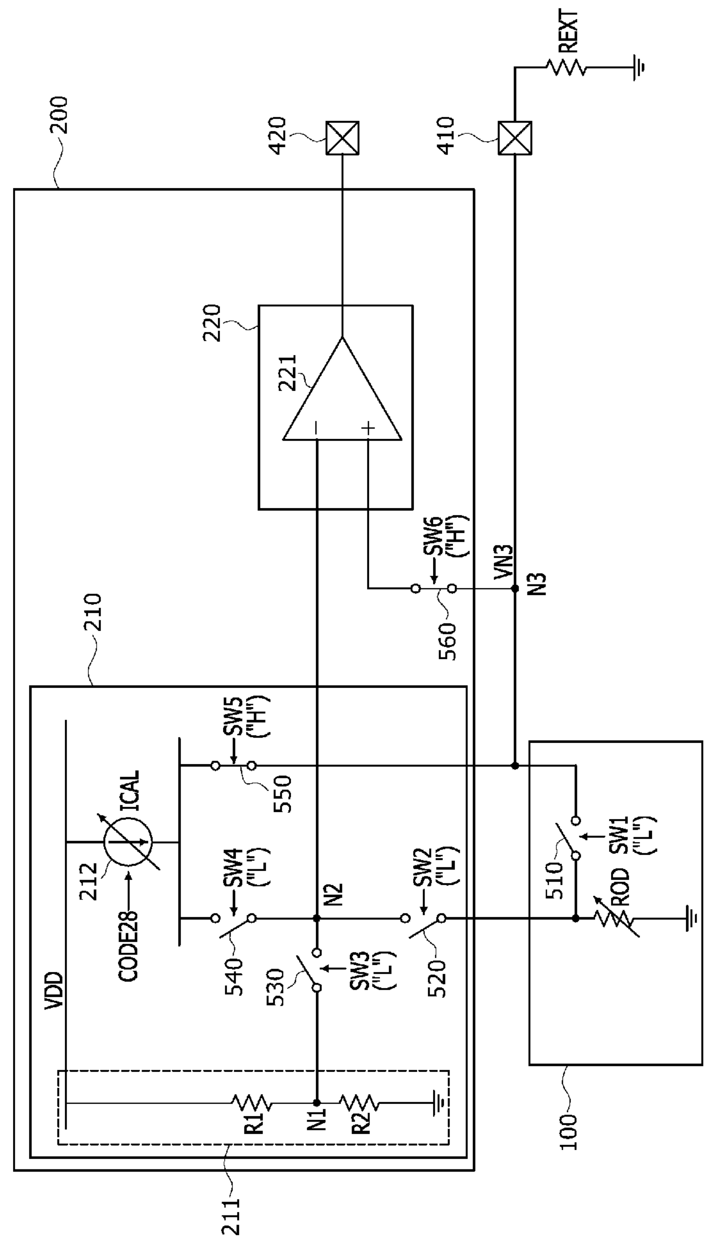

Referring to FIG. 13, the calibration control circuit (300 in FIG. 1) may perform a control operation for the $8^{th}$ second calibration step during the calibration process. Specifically, the calibration control circuit 300 may transmit, to the on-die resistor circuit 100 and the calibration circuit 200, the same switching control signals as those in the $1^{st}$ second calibration step. Accordingly, the states of the first to sixth switches 510 to 560 may be the same as those that have been described with reference to FIG. 7. As in the $1^{st}$ second calibration step, the third node voltage VN3 in the third node N3 may have the same voltage level as a voltage that is applied to both ends of the external resistor REXT by the calibration current ICAL.

Figure 14:
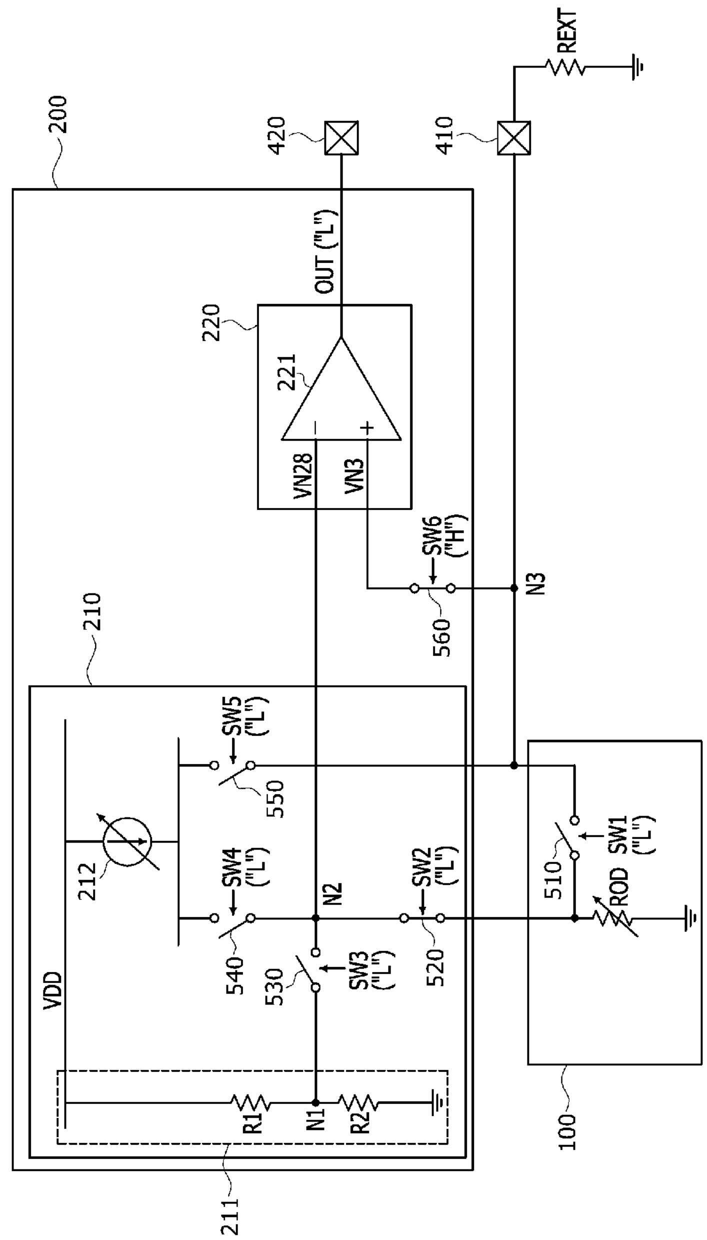

Referring to FIG. 14, the calibration control circuit (300 in FIG. 1) may perform a control operation for the $8^{th}$ third calibration step during the calibration process. Specifically, the calibration control circuit 300 may transmit, to the on-die resistor circuit 100 and the calibration circuit 200, the same switching control signals as those in the $1^{st}$ third calibration step. Accordingly, the states of the first to sixth switches 510 to 560 may be the same as those that have been described with reference to FIG. 8. The second node voltage VN28 (i.e., a voltage that is applied to both ends of the on-die resistor ROD by the calibration current ICAL) may be supplied to the first input terminal of the comparator 221

(i.e., the negative input terminal) as the first input signal. Furthermore, the third node voltage VN3 (i.e., a voltage that is applied to both ends of the external resistor REXT by the calibration current ICAL) may be supplied to the second input terminal of the comparator 221 (i.e., the positive input terminal) as the second input signal. When the second node voltage VN28 is higher than the third node voltage VN3, the comparator 221 may output the output signal OUT having a low level "L" through the output terminal. The output signal OUT having a low level "L" from the comparator 221 may be transmitted to the calibration control circuit 300. As the output signal OUT having a low level "L" is transmitted by the comparator 221, the calibration control circuit 300 may set a current resistance value of the on-die resistor ROD as a calibrated resistance value and may store the eighth resistance adjustment code CODE18 that has been provided to the on-die resistor ROD.

Figure 15:
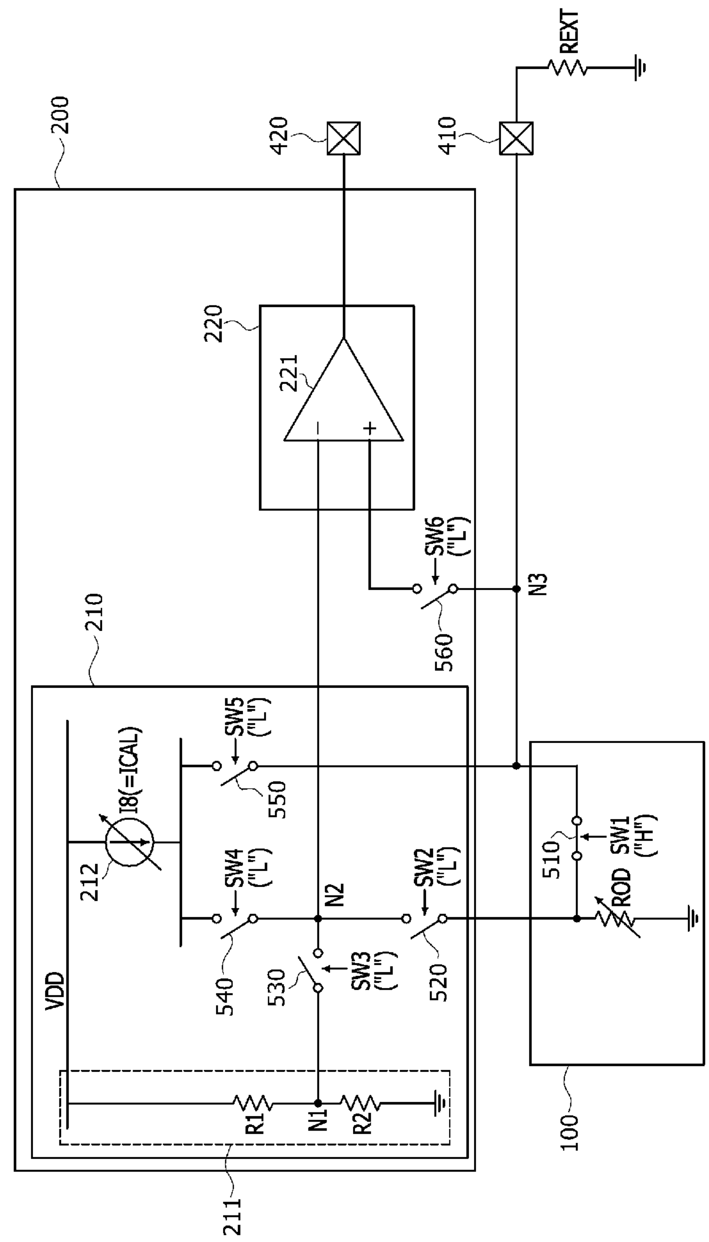
FIG. 15 is a circuit diagram illustrated to describe a connection state of the on-die resistor and the calibration circuit after the calibration of the on-die resistor is fully completed.

FIG. 15 is a circuit diagram illustrated to describe a connection state of the on-die resistor circuit 100 and the calibration circuit 200 after the calibration of the on-die resistor is completed. Referring to FIG. 15, when the calibration of a resistance value of the on-die resistor ROD is completed, the calibration control circuit (300 in FIG. 1) may block a connection between the calibration circuit 200 and the on-die resistor circuit 100 and a connection between the calibration circuit 200 and the first pad 410. Furthermore, the calibration control circuit 300 may connect the on-die resistor ROD of the on-die resistor circuit 100 and the first pad 410.

Specifically, the calibration control circuit 300 may open all of the second to sixth switches 520 to 560 by transmitting, to the calibration circuit 200, the second to sixth switching control signals SW2 to SW6 having a low level "L". Accordingly, an electrical connection between the calibration circuit 200 and the on-die resistor circuit 100 may be blocked. Furthermore, an electrical connection between the variable current source 212 of the calibration circuit 200 and the comparator 221 and the third node N3 may be blocked. Accordingly, all the connection of the calibration circuit 200 with the first pad 410 may be blocked. Accordingly, the calibration circuit 200 may no longer consume power after the calibration of the on-die resistor ROD is completed. The calibration control circuit 300 may close the first switch 510 by transmitting, to the on-die resistor circuit 100, the first switching control signal SW1 having a high level "H". Accordingly, the on-die resistor ROD of the on-die resistor circuit 100 and the first pad 410 may be electrically interconnected.

Figure 16:
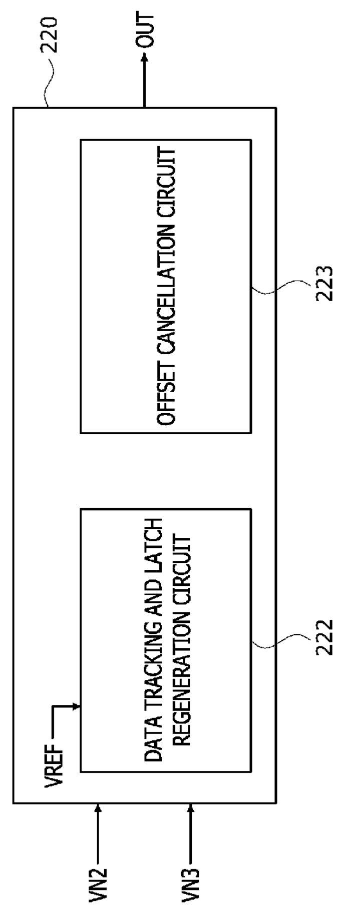
FIG. 16 is a block diagram illustrating a comparing circuit that is included in the calibration circuit in FIG. 1.

FIG. 16 is a block diagram illustrating the comparing circuit 220 that is included in the calibration circuit 200 in FIG. 1. Referring to FIG. 16, the comparing circuit 220 may include a data tracking and latch regeneration circuit 222 and an offset cancellation circuit 223. The data tracking and latch regeneration circuit 222 may perform a data tracking operation that generates an output signal by amplifying a signal that is generated as a result of a comparison between the first input signal and the second input signal. Furthermore, the data tracking and latch regeneration circuit 222 may perform a latch regeneration operation that releases the output of a latch circuit after the output signal is generated and swings the output of a difference between voltages of the first input signal and the second input signal toward an opposite voltage rail. For the latch regeneration operation, the data tracking and latch regeneration circuit 222 may receive the reference voltage VREF. The offset cancellation circuit 223 may perform an operation that cancels an offset within the comparing circuit 220. The operation that cancels an offset by the offset cancellation circuit 223 may be performed while the first calibration step and the second calibration step are being performed. Furthermore, the tracking operation and latch regeneration operation of the data tracking and latch regeneration circuit 222 may be performed from timing at which the third calibration step is performed. As described above, as the operation of cancelling an offset is performed before the data tracking and latch regeneration operation is performed, that is, while the first calibration step and the second calibration are being performed, a malfunction attributable to an offset within the comparing circuit 220 can be prevented.

Figure 17:
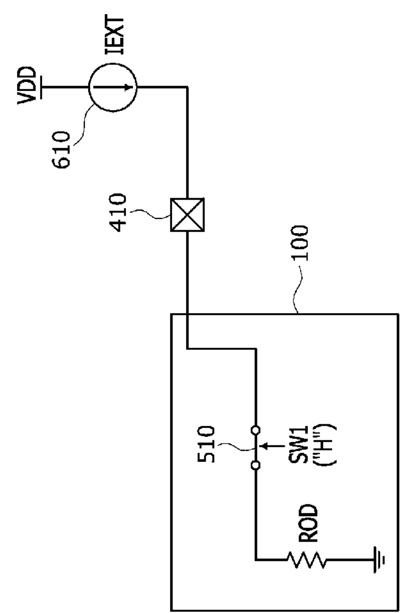
FIG. 17 is a circuit diagram illustrated to describe an example of an external calibration process for the semiconductor device according to an embodiment of the present disclosure.

FIG. 17 is a circuit diagram illustrated to describe an example of an external calibration process for the semiconductor device 10 according to an embodiment of the present disclosure. As illustrated in FIG. 17, after the calibration of the on-die resistor ROD is completed, that is, after the calibration circuit (200 in FIG. 1) is electrically separated from the on-die resistor circuit 100, calibration may be performed by using an external test apparatus. Specifically, one terminal of a test current source 610 may be connected to the first pad 410. The other terminal of the test current source 610 may be connected to the supply voltage line. An external current IEXT that is supplied from the test current source 610 may flow into the on-die resistor ROD. Accordingly, a voltage in the first pad 410 may have the voltage level of a voltage that is applied to both ends of the on-die resistor ROD by the external current IEXT. A resistance value of the on-die resistor ROD may be calculated by measuring the voltage in the first pad 410. When the calculated resistance value is different from a calibrated resistance value, the resistance value of the on-die resistor ROD may be changed by providing, from the calibration control circuit (300 in FIG. 1) to the on-die resistor ROD, the resistance adjustment code CODE1 having a value that is different from a current value.

Figure 18:
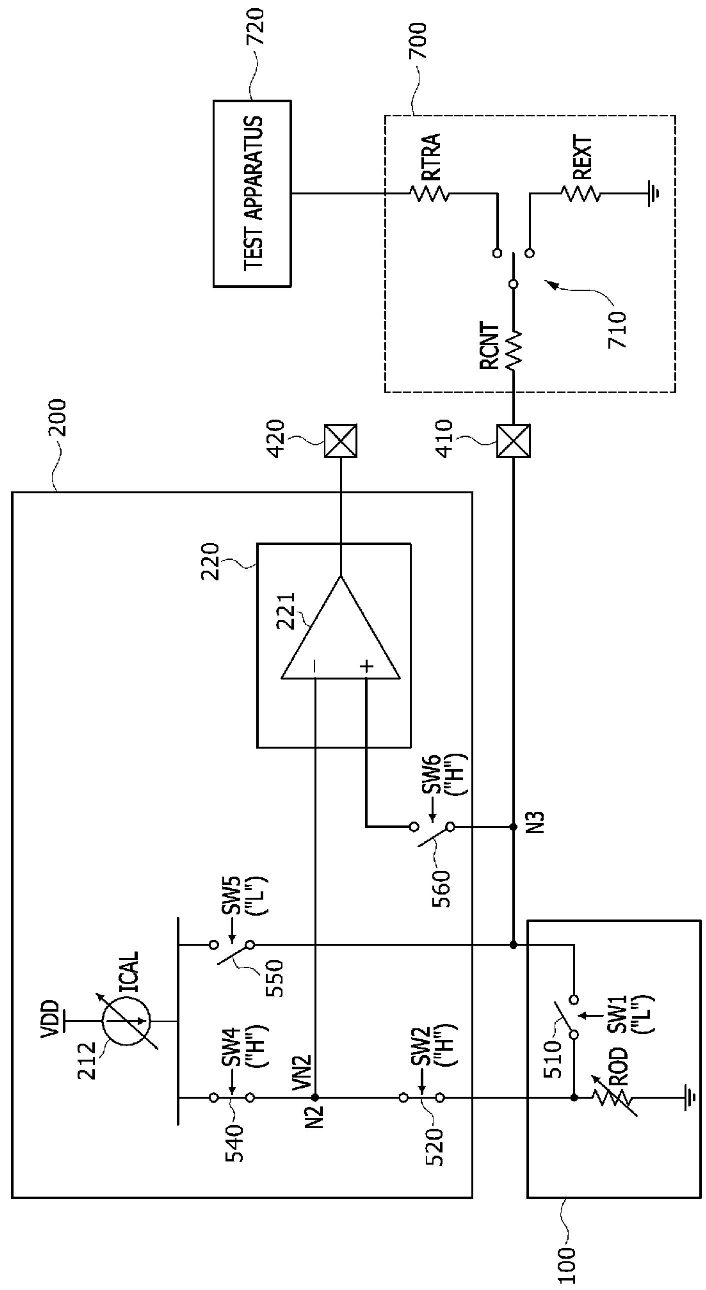
FIGS. 18 to 21 are circuit diagrams illustrated to describe another example of an external calibration process for the semiconductor device according to an embodiment of the present disclosure.
Figure 19:
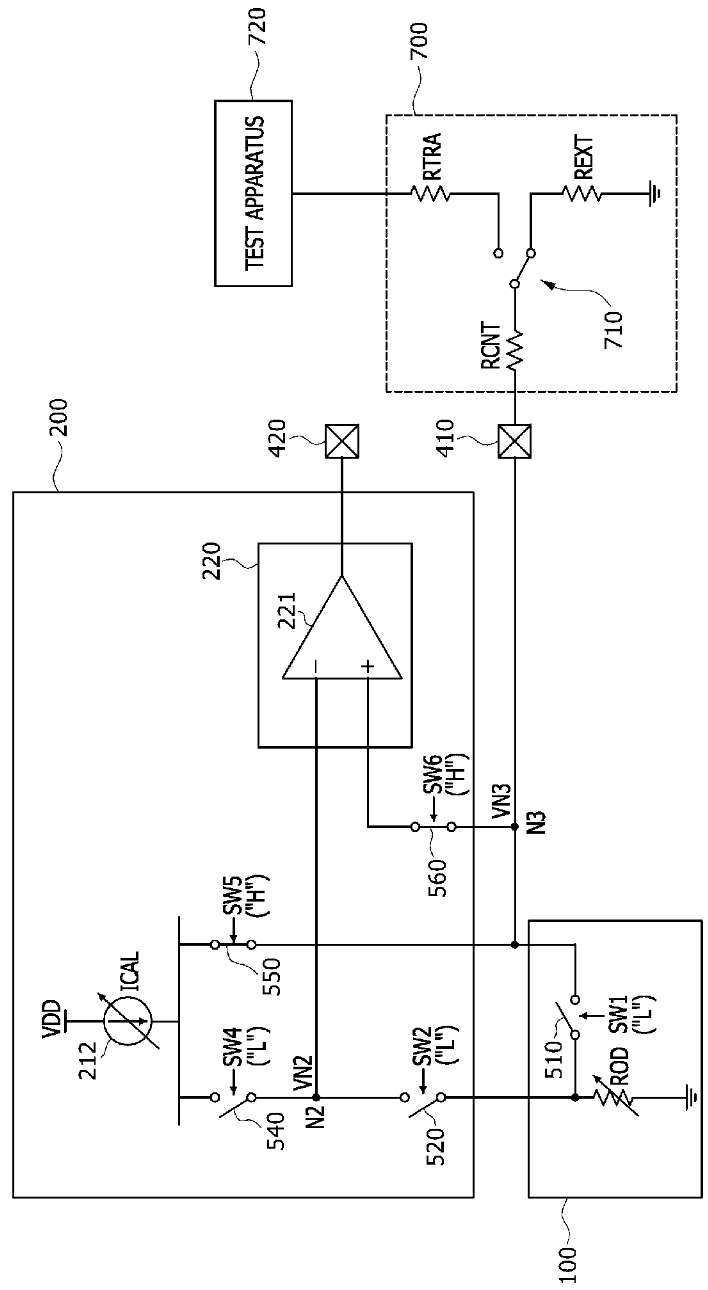

FIGS. 18 to 21 are circuit diagrams illustrated to describe another example of an external calibration process for the semiconductor device 10 according to an embodiment of the present disclosure. In FIGS. 18 and 19, the same reference numerals as those in FIG. 2 denote the same elements, and a redundant description of the same elements is omitted. According to the present example, a temperature change in the on-die resistor ROD of the semiconductor device (10 in FIG. 1) may be measured in various conditions by using an external test apparatus. A resistance value of the on-die resistor ROD may be changed suitably for a use condition based on the results of the measurement.

First, referring to FIG. 18, an external test circuit 700 may be connected through the first pad 410 of the semiconductor device 10. The external test circuit 700 may include a contact resistor RCNT, an external resistor REXT, a trace resistor RTRA, and an external switch 710. The contact resistor RCNT may be disposed between the first pad 410 and a first terminal of the external switch 710. The external resistor REXT may be disposed between a second terminal of the external switch 710 and the ground terminal. The external resistor REXT may have the same resistance value as a calibrated resistance value of the on-die resistor ROD. The trace resistor RTRA may be disposed between a third terminal of the external switch 710 and the test apparatus 720. A switching operation of the external switch 710 may be controlled by the test apparatus 720. The external switch 710 may perform a switching operation that connects the first terminal and second terminal or connects the first terminal and the third terminal.

In the state in which the on-die resistor ROD has a calibrated resistance value as in the first calibration step that has been described with reference to FIG. 6, the calibration control circuit (300 in FIG. 1) may supply the second node N2 with the second node voltage VN2 that is identical to a voltage that is applied to both ends of the on-die resistor ROD by the calibration current ICAL.

Referring to FIG. 19, in the state in which the first terminal and second terminal of the external switch 710 have been connected, the calibration control circuit (300 in FIG. 1) may supply the third node N3 with the third node voltage VN3 having the same voltage level as that of a voltage that is applied to the contact resistor RCNT and the external resistor REXT by the calibration current ICAL, as in the second calibration step that has been described with reference to FIG. 7.

Figure 20:
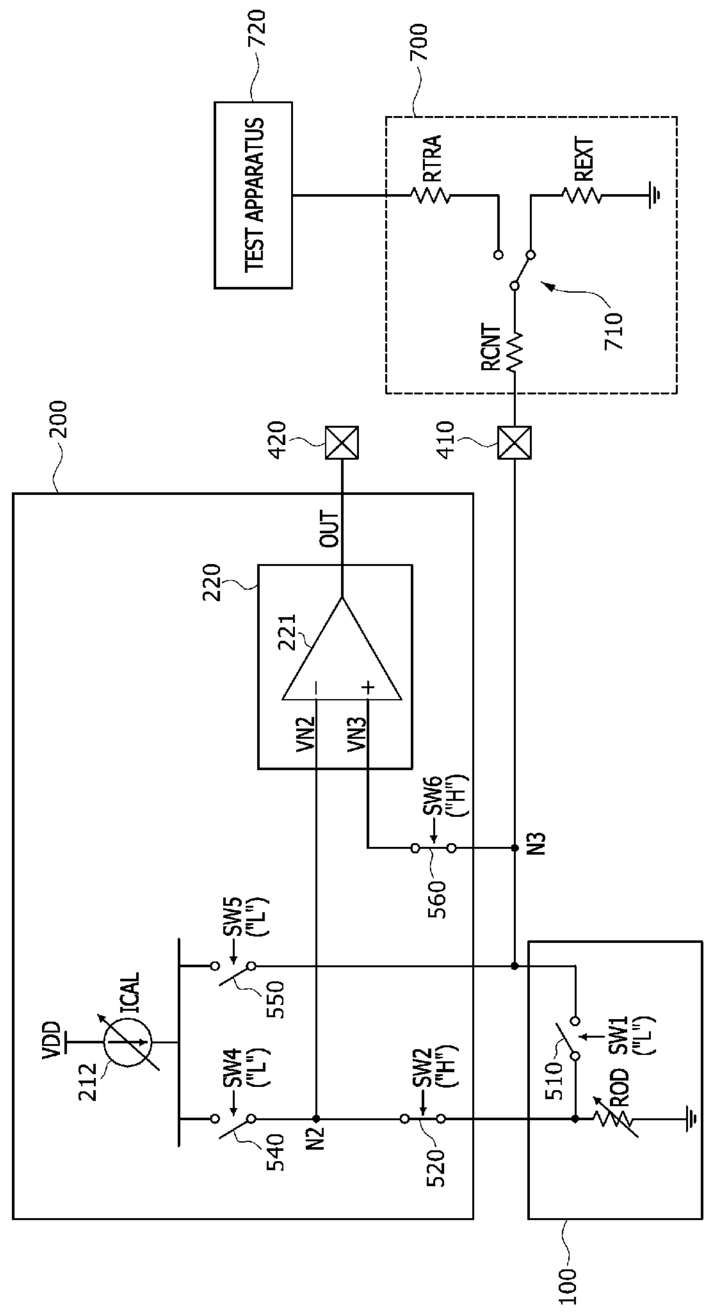

Referring to FIG. 20, the calibration control circuit (300 in FIG. 1) may input the second node voltage VN2 and the third node voltage VN3 to the first input terminal and second input terminal of the comparator 221, respectively, as in the third calibration step that has been described with reference to FIG. 8. The comparator 221 may compare the second node voltage VN2 and the third node voltage VN3 and may output the output signal OUT having a logic level according to a result of the comparison. The output signal OUT that is output by the comparator 221 may be transmitted to the test apparatus 720 through the second pad 420. When the process that has been described with reference to FIGS. 18 to 20 is repeated while changing a resistance value of the on-die resistor ROD until the second node voltage VN2 and the third node voltage VN3 have close voltage levels, a resistance value of the on-die resistor ROD may become a value that is obtained by adding a resistance value of the contact resistor RCNT and a resistance value of the external resistor REXT.

Figure 21:
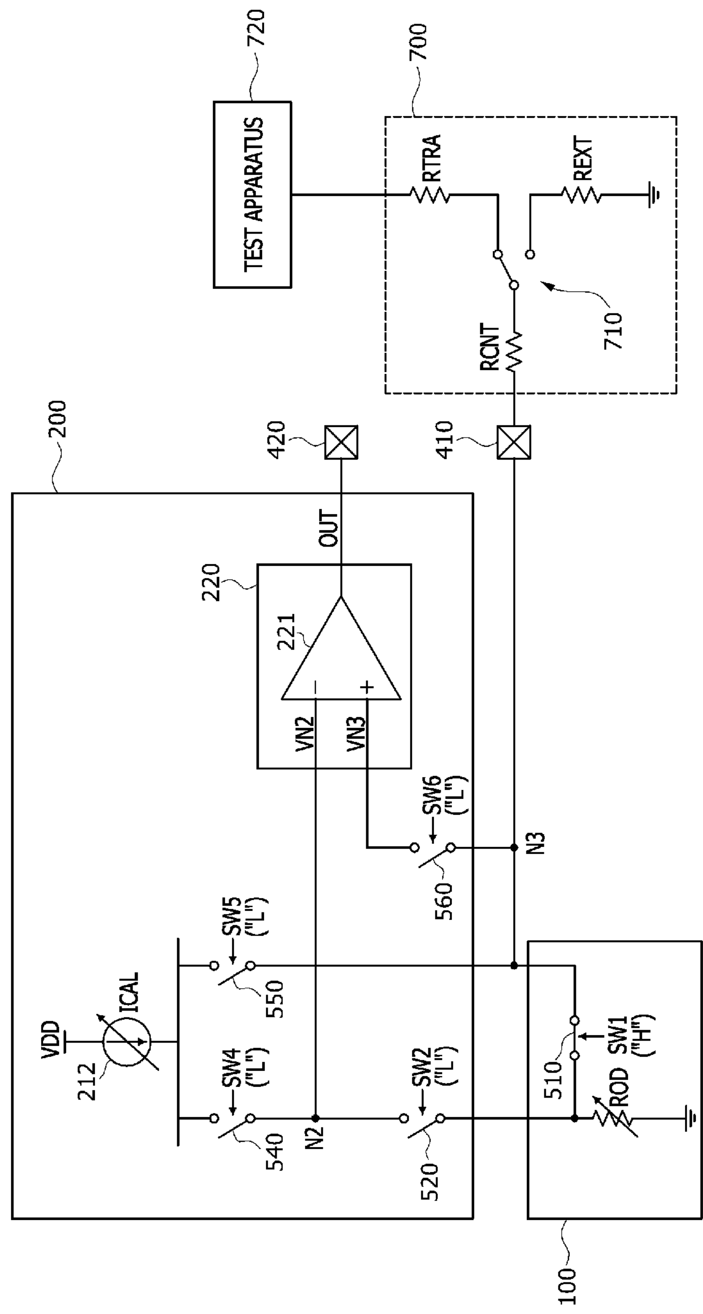

Referring to FIG. 21, after the resistance value of the on-die resistor ROD is calibrated as the value that has been obtained by adding the resistance value of the contact resistor RCNT and the resistance value of the external resistor REXT through the process that has been described with reference to FIGS. 18 to 20, the first terminal and third terminal of the external switch 710 may be connected. The calibration control circuit (300 in FIG. 1) may block both the connection between the calibration circuit 200 and the on-die resistor circuit 100 and the connection between the calibration circuit 200 and the first pad 410. Furthermore, the calibration control circuit (300 in FIG. 1) may connect the on-die resistor ROD and the first pad 410 by closing the first switch 510. The test equipment 720 may measure a resistance value on a path along which the trace resistor RTRA, the contact resistor RCNT, and the on-die resistor ROD are connected in series. The measured resistance value may have a value that is obtained by adding all of the resistance value of the on-die resistor ROD, the resistance value of the contact resistor RCNT, and a resistance value of the trace resistor RTRA. The resistance value of the trace resistor RTRA may be a value that may be known through direct measurement. Accordingly, a resistance value that is obtained by subtracting the resistance value of the trace resistor RTRA from the measured resistance value may become a value that is obtained by adding the resistance value of the external resistor REXT and twice the resistance value of the contact resistor RCNT. A change in the resistance value of the on-die resistor ROD according to a temperature change or a change in a process condition can be checked by performing such measurement of resistance values under several conditions, for example, various temperature conditions or process conditions, and a subsequent and proper correction is made possible.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A semiconductor device comprising:

an on-die resistor circuit comprising an on-die resistor;

a calibration circuit configured to perform a calibration operation on the on-die resistor, the calibration including a second node;

a calibration control circuit configured to control the calibration operation of the calibration circuit;

a first pad connected to the on-die resistor circuit through a third node and the calibration circuit; and a second pad connected the calibration circuit, wherein the calibration circuit comprises:

a current generating circuit configured to supply a calibration current to the on-die resistor; and a comparing circuit configured to compare a magnitude of a first input signal that is generated by the calibration current and the on-die resistor with a magnitude of a second input signal that is generated by the calibration current and an external resistor, wherein a first terminal of the on-die resistor is connected to the third node through a first switch and is connected to the second node through a second switch, and wherein a second terminal of the on-die resistor is connected to a ground terminal.

2. The semiconductor device of claim 1, wherein the on-die resistor, the calibration circuit, and the calibration control circuit are integrated into a single die.

3. The semiconductor device of claim 1, wherein the on-die resistor is configured to have a resistance value that varies based on a value of a resistance adjustment code that is transmitted by the calibration control circuit.

4. The semiconductor device of claim 1, wherein the current generating circuit comprises:

a variable current source configured to increase an amount of current of the variable current source in proportion to a value of a current adjustment code that is transmitted by the calibration control circuit; and a voltage division circuit configured to generate a reference voltage from a supply voltage and configured to supply the reference voltage to a first node.

5. The semiconductor device of claim 4, wherein the first node is connected to the second node through a third switch.

6. The semiconductor device of claim 5, wherein a first terminal of the variable current source is connected to a supply voltage line, and wherein a second terminal of the variable current source is connected to the second node and the third node through a fourth switch and a fifth switch, respectively.

7. The semiconductor device of claim 6, wherein the comparing circuit comprises a first input terminal, a second input terminal, and an output terminal, wherein the first input terminal is connected to the second node, wherein the second input terminal is connected to the third node through a sixth switch, and wherein the output terminal is connected to the calibration control circuit and the second pad.

8. The semiconductor device of claim 7, wherein the calibration control circuit is configured to:

provide the variable current source with a start value of the current adjustment code in a state in which switching control signals for closing the third switch, the fifth switch, and the sixth switch and for opening the first switch, the second switch, and the fourth switch have been provided to the calibration circuit, increase the value of the current adjustment code when a logic level of an output signal that is transmitted by the comparing circuit is not changed and provide the variable current source with the increased value, and set, as a value of the calibration current, a current value corresponding to a value of the current adjustment code when the logic level of the output signal that is transmitted by the comparing circuit is changed.

9. The semiconductor device of claim 8, wherein the calibration control circuit is configured to transmit, to the calibration circuit, a switching control signal for opening the third switch when the value of the calibration current is set.

10. The semiconductor device of claim 9, wherein the calibration control circuit is configured to:

perform a first calibration control operation that sets the first input signal of the comparing circuit as a voltage in the second node by the calibration current from the variable current source by providing the on-die resistor with a start value of a resistance adjustment code in a state in which switching control signals for opening the first switch, the third switch, the fifth switch, and the sixth switch and for closing the second switch and the fourth switch have been provided to the calibration circuit, perform a second calibration control operation that sets the second input signal of the comparing circuit as a voltage in the third node by the calibration current from the variable current source in a state in which switching control signals for opening the first switch, the second switch, the third switch, and the fourth switch and for closing the fifth switch and the sixth switch have been provided to the calibration circuit, and perform a third calibration control operation that increases a value of the resistance adjustment code when the logic level of the output signal that is transmitted by the comparing circuit is not changed, provides the increased value to the on-die resistor, and sets, as a resistance value of the on-die resistor, a resistance value corresponding to a value of the resistance adjustment code when the logic level of the output signal that is transmitted by the comparing circuit is changed.

11. The semiconductor device of claim 10, wherein, when the resistance value of the on-die resistor is set by the third calibration control operation, the calibration control circuit is configured to:

block an electrical connection between the first pad and the calibration circuit by providing the calibration circuit with switching control signals to open the second switch to the sixth switch, and electrically connect the first pad and the on-die resistor by providing the on-die resistor circuit with a switching control signal to close the first switch.

12. The semiconductor device of claim 10, wherein the comparator comprises:

a data tracking and latch regeneration circuit configured to perform a tracking operation and a latch regeneration operation on the first input signal and the second input signal; and an offset cancellation circuit configured to cancel an offset for the first input signal and the second input signal, wherein the offset cancellation circuit is configured to perform an operation of cancelling the offset while the first calibration operation and the second calibration operation are being performed, and the data tracking and latch regeneration circuit is configured to perform the tracking operation and the latch regeneration operation while the third calibration operation is being performed.

13. A method of calibrating an on-die resistor of a semiconductor device in which the on-die resistor and a calibration circuit configured to perform calibration on the on-die resistor are integrated in a single chip form, the method comprising:

setting a calibration current within the calibration circuit;

performing a first calibration process that sets a first input voltage that is applied to the on-die resistor by the calibration current;

performing a second calibration process that sets a second input voltage that is applied to an external resistor having a target resistance value of the on-die resistor by the calibration current; and performing a third calibration process that compares the first input voltage with the second input voltage and stores a resistance value of the on-die resistor when the first input voltage is higher than the second input voltage, wherein the setting of the calibration current comprises:

providing a current adjustment code to a variable current source of the calibration circuit so that a current having a rate corresponding to a value of the current adjustment code is supplied by the variable current source; and comparing a first voltage that is set with a second voltage that is applied to the external resistor by the current corresponding to the value of the current adjustment code, and setting, as the calibration current, the current having the rate corresponding to the value of the current adjustment code when voltage levels of the first voltage and the second voltage are close to each other.

14. The method of claim 13, wherein the performing of the first calibration process comprises performing the first calibration process by providing a first node voltage to a first input terminal of a comparator of the calibration circuit between the on-die resistor and the variable current source of the calibration circuit that outputs the calibration current.

15. The method of claim 14, wherein the performing of the second calibration process comprises performing the second calibration process by providing a second node voltage to a second input terminal of the comparator of the calibration circuit between the external resistor and the variable current source of the calibration circuit that outputs the calibration current.

16. The method of claim 15, wherein the performing of the third calibration process comprises:

performing the third calibration process by blocking a connection between the variable current source and the first node and the second node; and comparing the first node voltage with the second node voltage.

17. The method of claim 15, further comprising blocking an electrical connection between the calibration circuit and the on-die resistor after performing the third calibration process.

* * * * *